United States Patent
Kutney

(10) Patent No.: US 10,247,473 B2
(45) Date of Patent: Apr. 2, 2019

(54) METHODS AND APPARATUS FOR PROCESSING A SUBSTRATE TO REMOVE MOISTURE AND/OR RESIDUE

(71) Applicant: APPLIED MATERIALS, INC., Santa Clara, CA (US)

(72) Inventor: Michael C. Kutney, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 809 days.

(21) Appl. No.: 14/601,645

(22) Filed: Jan. 21, 2015

(65) Prior Publication Data
US 2015/0204606 A1  Jul. 23, 2015

Related U.S. Application Data

(60) Provisional application No. 61/929,897, filed on Jan. 21, 2014.

(51) Int. Cl.
*F26B 3/28* (2006.01)
*H01L 21/67* (2006.01)

(52) U.S. Cl.
CPC ........ *F26B 3/283* (2013.01); *H01L 21/67109* (2013.01)

(58) Field of Classification Search
None
See application file for complete search history.

(56) References Cited

U.S. PATENT DOCUMENTS

| 6,942,738 | B1* | 9/2005 | Nelson | H01L 21/67754 134/33 |
| 2011/0114623 | A1* | 5/2011 | Goodman | H01L 21/6719 219/385 |
| 2016/0095166 | A1 | 3/2016 | Miller | |
| 2017/0004982 | A1* | 1/2017 | Sundararajan | H01L 21/68785 |

* cited by examiner

*Primary Examiner* — Eric W Golightly
(74) *Attorney, Agent, or Firm* — Moser Taboada; Alan Taboada

(57) ABSTRACT

Embodiments of methods and apparatus for processing a substrate are provided herein. In some embodiments, an apparatus for processing a substrate includes a non-vacuum enclosure; at least one opening in the non-vacuum enclosure to insert a substrate into or remove a substrate from the non-vacuum enclosure; a movable substrate carrier, including a plurality of substrate holders, disposed within the non-vacuum enclosure to linearly move substrates disposed on the plurality of substrate holders; a heater to heat an interior of the non-vacuum enclosure; a gas supply to supply a gas to the interior of the non-vacuum enclosure; and a vent to exhaust the gas from the interior of the non-vacuum enclosure.

13 Claims, 4 Drawing Sheets

METHODS AND APPARATUS FOR PROCESSING A SUBSTRATE TO REMOVE MOISTURE AND/OR RESIDUE

CROSS-REFERENCE TO RELATED APPLICATIONS

This application claims benefit of U.S. provisional patent application Ser. No. 61/929,897, filed Jan. 21, 2014, which is herein incorporated by reference in its entirety.

FIELD

Embodiments of the present disclosure generally relate to substrate processing equipment.

BACKGROUND

Currently, standalone furnaces are used to pretreat a substrate (e.g., a semiconductor wafer) to drive off moisture and residues on the substrate. However, a separate furnace is costly and occupies a large amount of valuable space in a fab. Alternatively, degas and preclean chambers have been used to achieve similar results. However, such an alternative solution does not yield an optimal system throughput since the degas operation takes a relatively long time due to the extensive time required for moisture and residue removal. Also, in the degas chamber, the substrate is heated to about 300° C. and the chamber is pumped down to a low pressure. Although the process releases unwanted material from the substrate surface, the material will then be deposited onto the wall of the chamber. The preclean process removes and/or reduces oxidation from the substrate using hydrogen, which cleaves off the oxygen. However, the substrate should be immediately processed after the preclean process because if the substrate leaves a low-oxygen environment, oxidation will reoccur.

Therefore, the inventor has provided an improved substrate treatment apparatus for use with integrated fabrication systems.

SUMMARY

Embodiments of methods and apparatus for processing a substrate are provided herein. In some embodiments, an apparatus for processing a substrate includes a non-vacuum enclosure; at least one opening in the non-vacuum enclosure to insert a substrate into or remove a substrate from the non-vacuum enclosure; a movable substrate carrier, including a plurality of substrate holders, disposed within the non-vacuum enclosure to linearly move substrates disposed on the plurality of substrate holders; a heater to heat an interior of the non-vacuum enclosure; a gas supply to supply a gas to the interior of the non-vacuum enclosure; and a vent to exhaust the gas from the interior of the non-vacuum enclosure.

In some embodiments, an apparatus for processing a substrate includes a factory interface for interfacing with a substrate processing platform, the factory interface including a docking station and a factory interface robot to facilitate transfer of substrates from the factory interface to the substrate processing platform; a substrate treatment apparatus coupled to the factory interface such that the factory interface robot can place substrates into or remove substrates from the substrate treatment apparatus; and a gas supply coupled to the substrate treatment apparatus to provide a gas to an interior volume of the substrate treatment apparatus; wherein the substrate treatment apparatus includes: an enclosure; at least one opening in the enclosure to insert a substrate into or remove a substrate from the enclosure; a movable substrate carrier, including a plurality of substrate holders, disposed within the enclosure to linearly move substrates disposed on the plurality of substrate holders; a heater to heat an interior of the enclosure; and a vent to exhaust the gas from the interior of the enclosure.

In some embodiments, a method of treating a substrate includes placing a substrate onto one of a plurality of substrate holders of a movable substrate carrier within a non-vacuum enclosure of a substrate treatment apparatus; heating the interior of the non-vacuum enclosure; supplying a gas into the non-vacuum enclosure to react with a surface of the substrate; and exhausting the gas from the non-vacuum enclosure through a vent in the non-vacuum enclosure.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
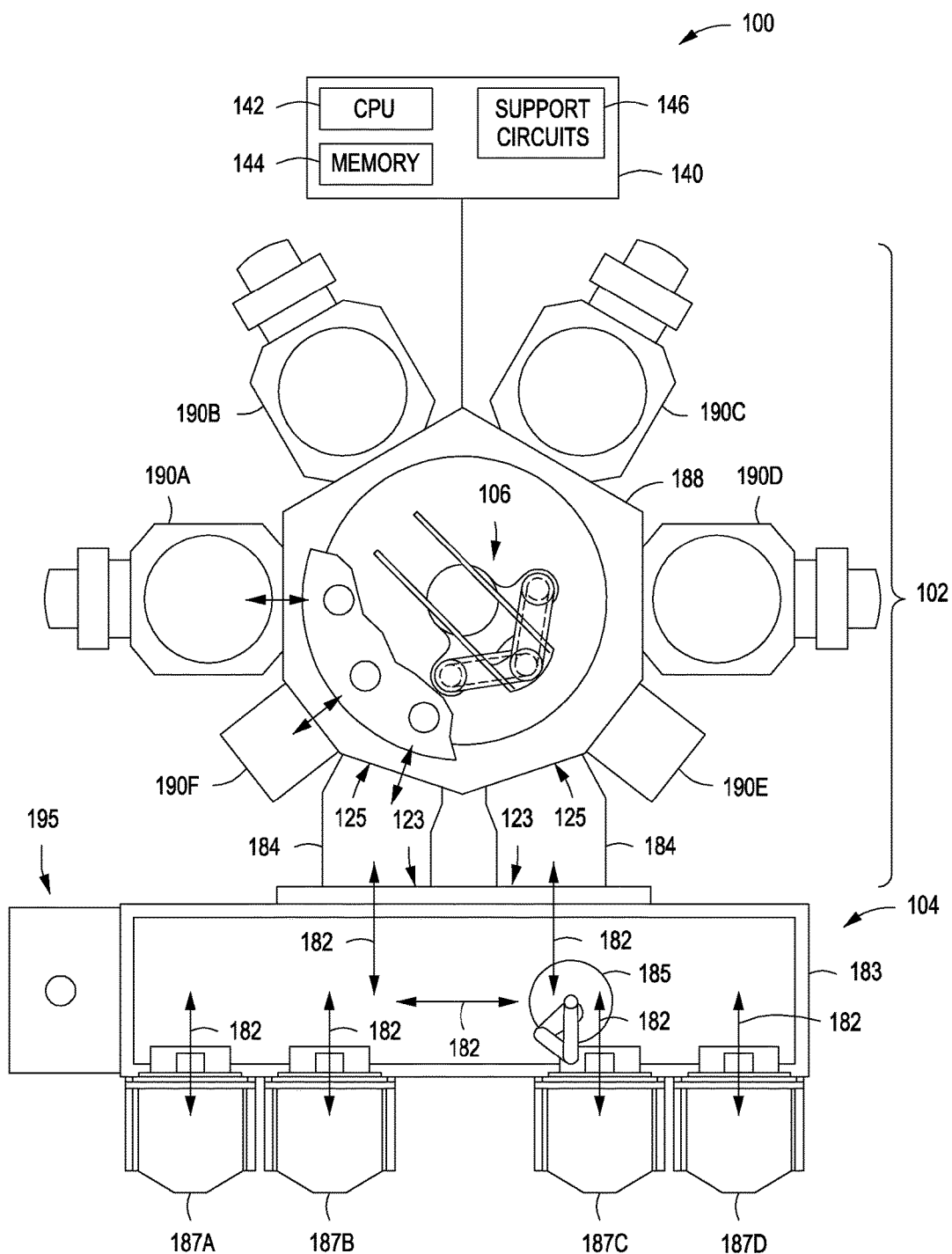
FIG. 1 is a processing system suitable for use with a substrate treatment apparatus in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure generally relate to substrate treatment methods and apparatus for use in integrated substrate fabrication systems. The inventive substrate treatment apparatus advantageously removes moisture and/or residue from more than one substrate at a time, thus improving the throughput of a multi-substrate processing system. Embodiments of the inventive substrate treatment apparatus advantageously mounts directly to a factory interface (FI) of a substrate processing tool and pretreats a substrate at atmospheric pressure, thus increasing throughput of the substrate processing tool while minimizing any negative impact on the floor space used by the substrate processing tool.

FIG. 1 is a schematic top-view diagram of an exemplary multi-chamber processing system 100 that may be suitable for use with the present inventive apparatus disclosed herein. Examples of suitable multi-chamber processing systems that may be suitably modified in accordance with the teachings provided herein include the ENDURA®, CENTURA®, and PRODUCER® processing systems or other suitable processing systems commercially available from Applied Materials, Inc., located in Santa Clara, Calif. Other processing systems (including those from other manufacturers) may be adapted to benefit from the disclosure.

In some embodiments, the multi-chamber processing system 100 may generally comprise a vacuum-tight processing platform 102, a factory interface 104, and a system controller 140. The processing platform 102 may include a plurality of process chambers 190A-F and at least one load-lock chamber (two shown) 184 that are coupled to a transfer chamber 188. A transfer robot 106 (described below with respect to FIGS. 2 and 3) is centrally disposed in the transfer chamber 188 to transfer substrates between the load lock chambers 184 and the process chambers 190A-F. The process chambers 190A-F may be configured to perform various functions including layer deposition including atomic layer deposition (ALD), chemical vapor deposition (CVD), physical vapor deposition (PVD), etch, pre-clean, de-gas, orientation and center-finding, annealing, and other substrate processes Each of the process chambers 190A-F may include a slit valve or other selectively sealable opening to selectively fluidly couple the respective inner volumes of the process chambers 190A-F to the inner volume of the transfer chamber 188. Similarly, each load lock chamber 184 may include a port to selectively fluidly couple the respective inner volumes of the load lock chambers 184 to the inner volume of the transfer chamber 188.

The factory interface 104 is coupled to the transfer chamber 188 via the load lock chambers 184. In some embodiments, each of the load lock chambers 184 may include a first port 123 coupled to the factory interface 104 and a second port 125 coupled to the transfer chamber 188. The load lock chambers 184 may be coupled to a pressure control system which pumps down and vents the load lock chambers 184 to facilitate passing the substrate between the vacuum environment of the transfer chamber 188 and the substantially ambient (e.g., atmospheric) environment of the factory interface 104.

In some embodiments, the factory interface 104 comprises at least one docking station 183 and at least one factory interface robot 185 (one shown) to facilitate transfer of substrates from the factory interface 104 to the processing platform 102 for processing through the load lock chambers 184. The docking station 183 is configured to accept one or more (four shown) front opening unified pods (FOUPs) 187A-D. Optionally, one or more metrology stations (not shown) may be coupled to the factory interface 104 to facilitate measurement of the substrate from the FOUPs 187A-D. A substrate treatment apparatus 195 may also be coupled to the factory interface 104 to enable treatment of the substrates before they are moved to the load lock chambers 184. The substrate treatment apparatus 195 is in a similar ambient environment as the factory interface 104 (e.g., at atmospheric pressure). The factory interface robot 185 disposed in the factory interface 104 is capable of linear and rotational movement (arrows 182) to shuttle cassettes of substrates between the substrate treatment apparatus 195, the load lock chambers 184, and the one or more FOUPs 187A-D. Although the substrate treatment apparatus 195 is depicted mounted in a particular location of the factory interface 104, the substrate treatment apparatus 195 may be mounted in other locations as well, such as in place of one of the FOUPS 187, atop the factory interface 104, or in a different location along the perimeter of the factory interface 104, so long as there is sufficient clearance and access for the factory interface robot 185 to move substrates between the various locations.

Figure 2:
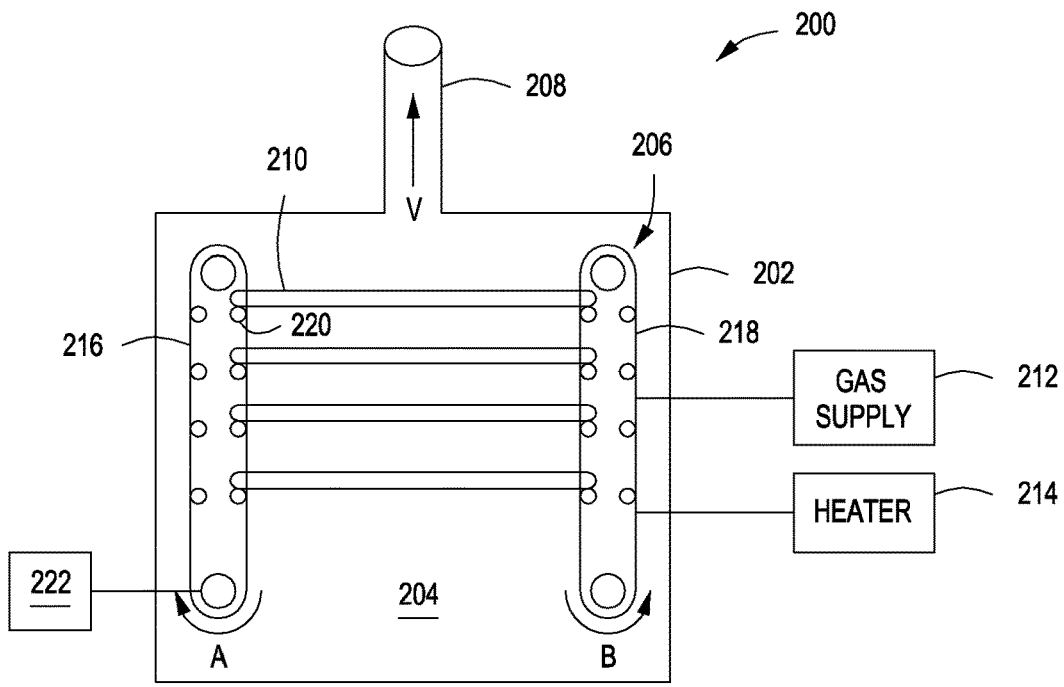
FIG. 2 is a schematic side view of a substrate treatment apparatus in accordance with some embodiments of the present disclosure.

FIG. 2 illustrates a schematic side view of a substrate treatment apparatus 200 according to some embodiments of the present disclosure. The substrate treatment apparatus 200 may be used as the substrate treatment apparatus 195 depicted in FIG. 1. Referring to FIG. 2, the substrate treatment apparatus 200 includes an enclosure 202 having an interior volume 204. A movable substrate carrier 206 is disposed in the interior volume 204. A gas supply 212 is provided to provide one or more gases to the interior volume 204. A vent 208 is disposed through the enclosure 202 to facilitate removal of the one or more gases from the interior volume 204. In some embodiments, the vent 208 is disposed at or near the top of the enclosure 202. A heater 214 may be provided to facilitate more rapid removal of contaminants disposed on the substrates being treated by the substrate treatment apparatus 200.

The enclosure 202 is suitable for use as an over and may include insulated walls to more efficiently retain heat and to maintain a safe temperature on outer surfaces of the enclosure 202. In some embodiments, the enclosure is a non-vacuum enclosure, meaning that the enclosure is not sealed sufficiently to maintain a vacuum environment within the enclosure. In some embodiments, the enclosure is a vacuum enclosure, meaning that the enclosure is sealed sufficiently to maintain a vacuum environment within the enclosure (although the apparatus may be used in a vacuum environment or at atmospheric pressure).

The movable substrate carrier 206 holds one or more substrates 210, and in some embodiments, a plurality of substrates 210. The movable substrate carrier 206 has a plurality of substrate holders or supports 220 to support the one or more substrates 210. In some embodiments, a pair of supports 220 are provided to support each of the one or more substrates 210 proximate an edge of the substrate 210 on opposing sides of the substrate 210. A motor 222, or other suitable mechanism may be provided to control the motion of the movable substrate carrier 206.

For example, as depicted in FIG. 2, in some embodiments, the substrate treatment apparatus 200 may include a conveyor including a first wireframe conveyor 216 and a second wireframe conveyor 218. Each of the first and second wireframe conveyors 216, 218 has a plurality of supports 220 to support the substrates 210. The first and second wireframe conveyors 216, 218 are spaced apart from each other sufficiently such that the supports 220 support the substrates 210 proximate the edge of the substrates 210 with sufficient clearance to allow placement and removal of the substrates 210 onto and off of the supports 220. In some embodiments, the supports 220 of the first and second wireframe conveyors 216, 218 may be configured to minimize or eliminate particle generation due to contact with the substrates 210 when disposed on the supports 220. For example, the supports 220 may have a coating or minimized support surfaces.

Motion of the first and second wireframe conveyors 216, 218 may be controlled by one or more motors (one motor 222 shown) or other drive system. The first and second wireframe conveyors 216, 218 rotate in opposite directions, as indicated by arrows A and B, to move the substrate 210 up or down in the interior volume 204. Although shown rotating such that the substrates 210 move downward within the interior volume, the rotation direction could be reversed such that the substrates 210 move upward. The direction of movement of the substrates 210 may be selected to minimize the possibility of removed particulate or other materials and or gases being redeposited on a substrate 210 when ready to be removed from the substrate treatment apparatus 200. For example, in the embodiments shown, the vent 208 is disposed in the top of the enclosure 202 and the substrates 210 move downward within the interior volume such that gas and heat flows upward, in a direction opposite the motion of the substrates 210. In such embodiments, the treated substrates being removed from the enclosure have less exposure to the flow of gases and possible particulate matter or other contaminants.

Figure 3:
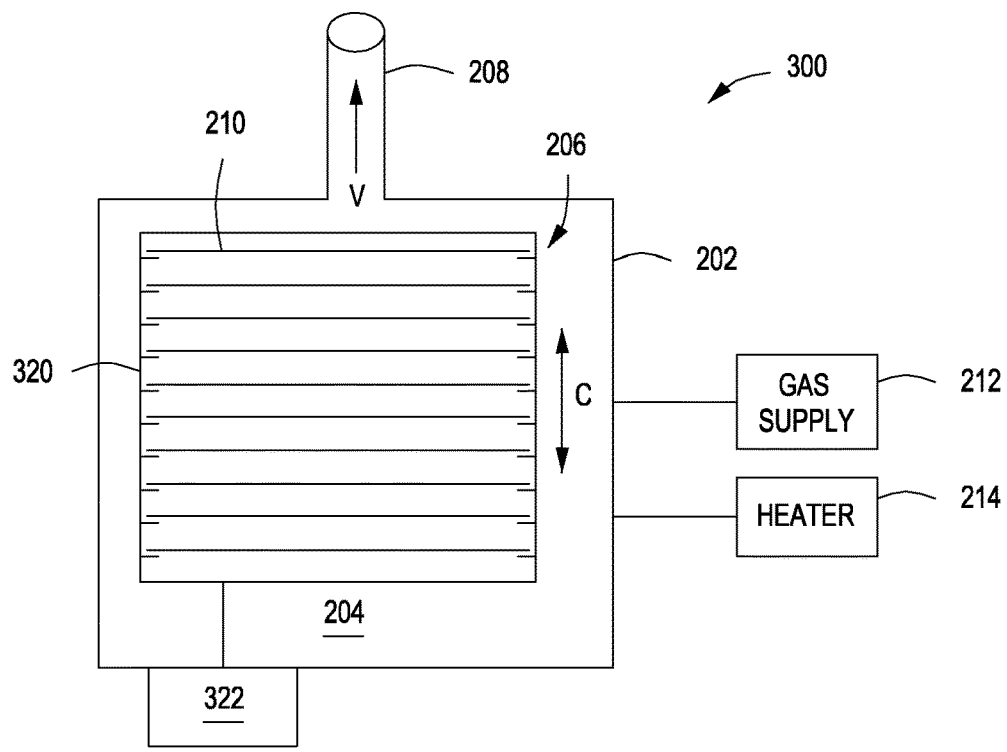
FIG. 3 is a schematic side view of a substrate treatment apparatus in accordance with some embodiments of the present disclosure.

Other configurations of the movable substrate carrier 206 are contemplated. For example, FIG. 3 depicts a schematic side view of a substrate treatment apparatus 300 in accordance with some embodiments of the present disclosure. The substrate treatment apparatus 300 is generally the same as substrate treatment apparatus 200 except that the movable substrate carrier 206 is replaced with a movable substrate carrier 306. As shown in FIG. 3, the movable substrate carrier 306 may be a multi-substrate carrier having a plurality of substrate supports or substrate holders 320 to support a plurality of substrates 210. The movable substrate carrier 306 may be fabricated from suitable process-compatible materials, such as, for example, quartz, ceramics, or high-temperature plastics. An actuator 322 is provided to move the movable substrate carrier 306 linearly, as represented by arrow C.

Returning to FIG. 2, the gas supply 212 is in fluid communication with the interior volume 204 to supply an inert gas to the interior volume 204. In some embodiments, an inert gas or a gas mixture including an inert gas and about 0 to about 5 percent of a reactive gas may be provided. Examples of suitable inert gases include noble gases (such as argon or helium), nitrogen, and the like. Examples of suitable reactive gases include hydrogen gas ($H_2$), ammonia ($NH_3$), oxygen ($O_2$), and the like. The vent 208 facilitates exhaust of the gases from the interior volume 204. In some embodiments, the gas mixture may contain greater amounts of the reactive gas, including up to 100% reactive gas. In embodiments where amounts of reactive gas are considered unsafe per industrial standards or other regulations, the interior volume 204 can be sealed off from the surrounding environment, for example, by the use of gas curtains, doors to cover the openings, or the like.

The heater 214 is provided to heat the interior volume 204 to a first temperature, for example, to about 75 to about 300° C. In some embodiments, the heater 214 may include a resistive heater or the like. The first temperature may be determined based on the type of substrate 210 inside of the substrate treatment apparatus 200. The heater 214 may heat the walls surrounding the interior volume 204 to a temperature necessary to achieve the first temperature in the interior volume 204.

The enclosure 202 (or 302) includes one or more openings disposed through a wall of the enclosure to insert and/or retrieve a substrate from the enclosure. The one or more openings generally face the factory interface 104 to facilitate interfacing with the factory interface robot 185. Alternatively, the one or more openings may face a direction suitable for interfacing with a substrate transfer mechanism to insert and remove substrates from the enclosure 202.

Figure 4:
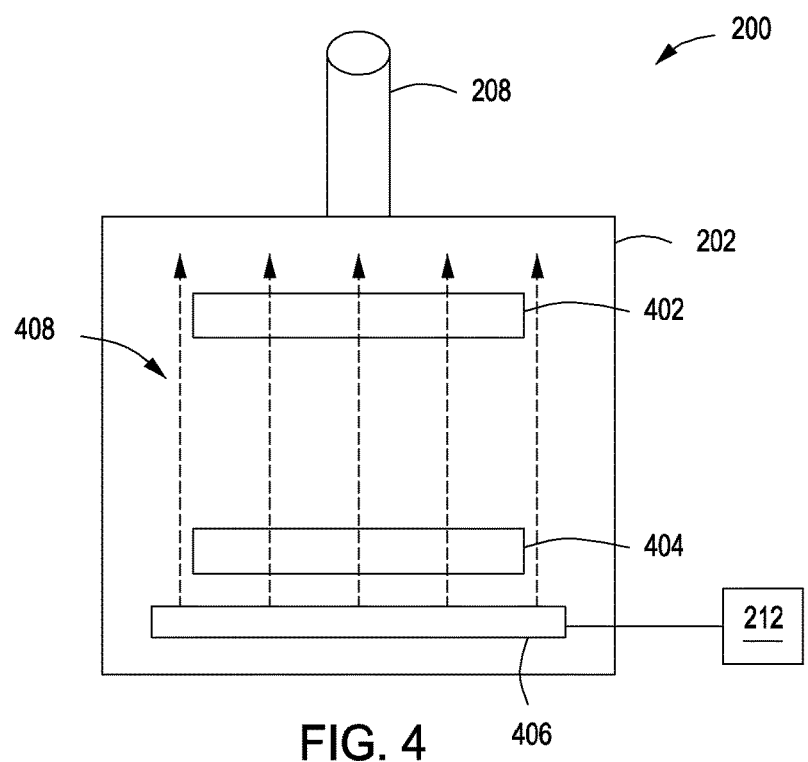
FIG. 4 is a side view of the substrate treatment apparatus of FIG. 2 in accordance with some embodiments of the present disclosure.
Figure 5:
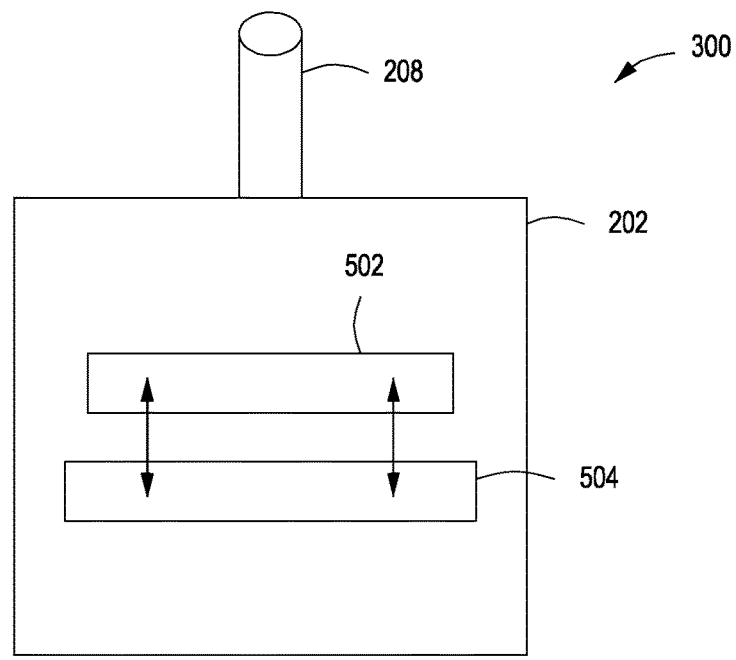
FIG. 5 is a side view of the substrate treatment apparatus of FIG. 3 in accordance with some embodiments of the present disclosure.

For example, as depicted in FIG. 4, the substrate treatment apparatus 200 includes a first opening 402 disposed near an upper region of the enclosure 202 (i.e., proximate to the vent 208) and a second opening 404 disposed near a lower region of the enclosure 202. Alternatively, as depicted in FIG. 5, a single opening 502 is disposed in the enclosure 202. The first and second openings 402, 404 and the single opening 502 are sized to allow a substrate to be placed on and removed from the movable substrate carrier 206. For example, the openings are sized to allow a substrate being carried by a robot (e.g., the factory interface robot 185) to be transferred through the openings. The openings may further be minimized to minimize one or more of heat loss from the enclosure 202 to the surrounding environment or movement of gases and/or particulate matter into the enclosure 202. The moveable substrate carrier may be moved in an upward direction and a downward direction to align ones of the supports 220 with the one or more openings (e.g., the first and second openings 302, 304 or the single opening 502) to facilitate insertion or removal of the substrate 210 from the substrate treatment apparatus 200, 300.

In some embodiments, a gas curtain may be provided across the one or more openings (e.g., the first and second openings 302, 304 and the single opening 502) to facilitate prevention of contaminants from entering into the enclosure 202 and depositing on the substrates disposed therein and to further minimize heat loss to the environment outside of the enclosure 202. For example, as depicted in FIG. 4, the gas supply 212 may be additionally coupled to a manifold 406 having a plurality of outlets dispersed along the length of the manifold 406 and arranged to provide a gas curtain 408 when gas is supplied from the gas supply 212 during use. Alternatively, a different gas supply may be coupled to the manifold 406 to provide the gas curtain. Suitable gases for providing the gas curtain include inert gases such as those described above with respect to the gas supply 212. In some embodiments, a door may seal the first and second openings 302, 304 (or single opening 502) when substrates 210 are not being transferred to/from the substrate treatment apparatus 200. For example the door 504, depicted in FIG. 5, may be provided to selectively seal or open the openings in the enclosure 202. The door 504 may be manually operated or automatic.

In some embodiments, the interior volume 204 is kept at atmospheric pressure (i.e., a non-vacuum enclosure) to increase throughput of the multi-chamber processing system 100. Alternatively, the interior volume 204 may be evacuated to achieve a sub-atmospheric pressure further increasing the ability of the substrate treatment apparatus 200 to remove moisture from the substrates 210. To ensure that a proper sub-atmospheric pressure environment exists in the interior volume 204, the first and second openings 302, 304 (or single opening 502) may be sealed off (for example, by a door such as the door 504). In some embodiments, a pump (not shown) may be coupled to the vent 208 to maintain the pressure within the interior volume 204 at or within a predetermined setpoint or range.

In use, the factory interface robot 185 removes a substrate 210 from any of the FOUPs 187A-D and places the substrate 210 onto the movable substrate carrier 206 through the first opening 402 in the enclosure 202. The movable substrate carrier 206 moves the substrate (e.g., downward) to allow placement of another substrate onto the movable substrate carrier 206. After the substrate 210 is placed within the substrate treatment apparatus 200, the heat and gas inside of the interior volume 204 may react with moisture and oxidation on a surface of the substrate 210 to remove at least some of the moisture and oxidation. The moisture and any reaction byproducts, along with the gas flowing through the enclosure 202, are exhausted through the vent 208 to appropriate exhaust handling equipment. In some embodiments, the movable substrate carrier 206 moves the substrate 210 in a direction opposite an exhaust direction (e.g., downward in the embodiments shown in the Figures) so that the reaction byproducts do not contaminate already treated substrates disposed in the enclosure 202. Although the vent 208 is depicted at the top of the enclosure 202, the vent 208 may instead be disposed at the bottom or other locations of the enclosure 202. In some embodiments, the movable substrate carrier 206 moves the substrate 210 placed thereon in a direction opposite the exhausting direction.

Figure 6:
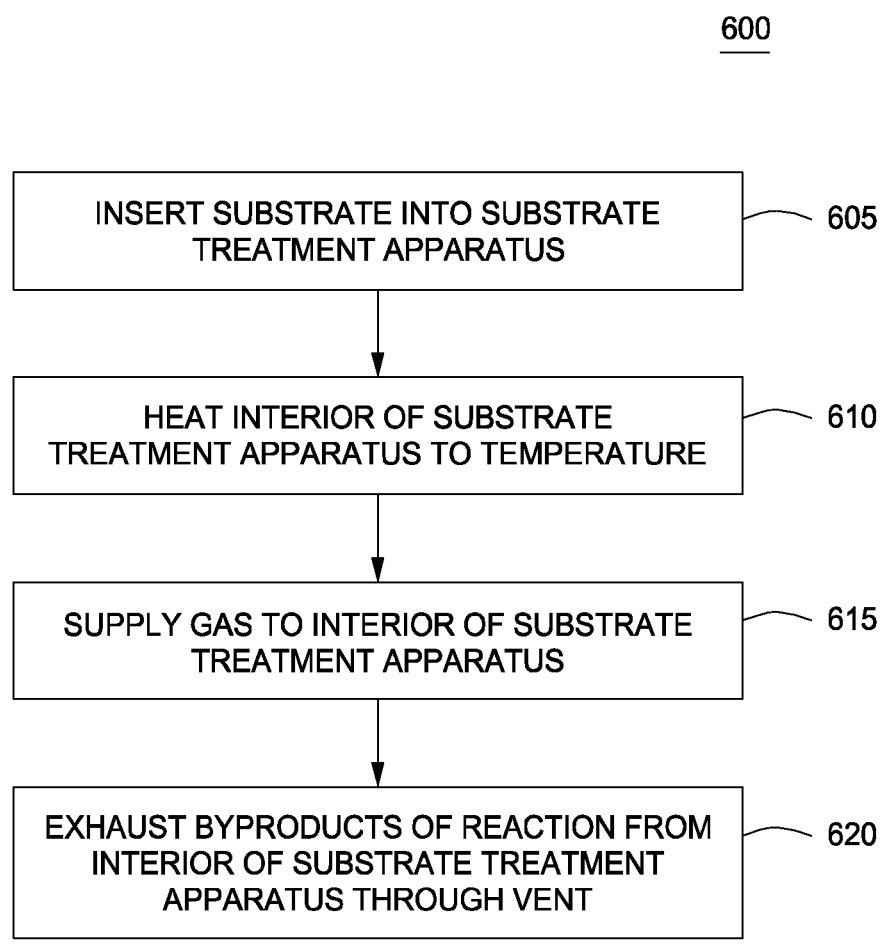
FIG. 6 is a flowchart of a substrate treatment method in accordance with some embodiments of the present disclosure.

For example, FIG. 6 illustrates a method 600 of treating a substrate in accordance with some embodiments of the present disclosure. The method 600 generally begins at 605, where a substrate 210 is inserted into the enclosure 202 of the substrate treatment apparatus 200. Specifically, the substrate 210 is inserted onto a support of the movable substrate carrier 206, 306. At 610, the interior of the enclosure 202 is heated to a temperature of about 75 to about 300° C. At 615, a gas comprising an inert gas, a reactive gas, or a mixture of the inert gas and the reactive gas (as disclosed above) is supplied to the interior of the enclosure 202. At 620, the gas is exhausted from the enclosure 202 through the vent 208 (drawing moisture and any reaction byproducts with the moisture).

In some embodiments, the substrate treatment apparatus 200 utilizes a batch method, in which multiple substrates 210 may be placed onto a plurality of supports of the movable substrate carrier 206, 306 for simultaneous treatment. Batch processing of multiple substrates may be advantageous if the multi-chamber processing system 100 receives a substrate during a time interval that is less than a treatment time for the method 600. For example, if the multi-chamber processing system 100 receives a substrate every minute and the method 600 is performed for five minutes, the method 600 may advantageously be performed simultaneously on five or more substrates at a time.

Returning to FIG. 1, the system controller 140 controls operation of the multi-chamber processing system 100 using a direct control of one or more of the processing platform 102 and factory interface 104 components (i.e., the process chambers 190A-F, transfer robot 106, etc.) or alternatively, by controlling the computers (or controllers) associated with the processing platform 102 and factory interface 104 components. The system controller 140 generally includes a central processing unit (CPU) 142, a memory 144, and support circuits 146. The CPU 142 may be one of any form of a general purpose computer processor that can be used in an industrial setting. The memory 144, or computer-readable medium, is accessible by the CPU 138 and may be one or more of readily available memory such as random access memory (RAM), read only memory (ROM), floppy disk, hard disk, or any other form of digital storage, local or remote. The support circuits 146 are conventionally coupled to the CPU 142 and may comprise cache, clock circuits, input/output subsystems, power supplies, and the like.

While the foregoing is directed to embodiments of the present disclosure, other and further embodiments of the disclosure may be devised without departing from the basic scope thereof.

The invention claimed is:

1. An apparatus for processing a substrate, comprising:
a non-vacuum enclosure;
at least one opening in the non-vacuum enclosure to insert a substrate into or remove a substrate from the non-vacuum enclosure;
a movable substrate carrier, including a plurality of substrate holders, disposed within the non-vacuum enclosure to support a plurality of substrates in a vertically spaced-apart relation and to linearly move the plurality of substrates when disposed on the plurality of substrate holders;
a heater to heat an interior of the non-vacuum enclosure;
a gas supply to supply a gas to the interior of the non-vacuum enclosure; and
a vent to exhaust the gas from the interior of the non-vacuum enclosure.

2. The apparatus of claim 1, wherein the heater is configured to heat the interior of the non-vacuum enclosure to a temperature of about 75 to about 300° C.

3. The apparatus of claim 1, wherein the gas supply provides an inert gas.

4. The apparatus of claim 1, wherein the gas supply provides a gas mixture of an inert gas and a reactive gas.

5. The apparatus of claim 1, wherein the gas supply provides a reactive gas.

6. The apparatus of claim 1, wherein the movable substrate carrier includes a conveyor to move the substrates in a direction opposite to an exhausting direction.

7. The apparatus of claim 6, wherein the at least one opening includes a first opening disposed in an upper region of the non-vacuum enclosure and a second opening disposed in a lower region of the non-vacuum enclosure.

8. The apparatus of claim 1, wherein each of the plurality of substrate holders includes a pair of supports for supporting each substrate proximate an edge of the substrate.

9. The apparatus of claim 1, wherein the at least one opening is a single opening through which the substrate is inserted and removed.

10. The apparatus of claim 9, wherein the movable substrate carrier can move the substrate holders in an upward direction and a downward direction to selectively align ones of the plurality of substrate holders with the single opening.

11. An apparatus for processing a substrate, comprising:
a factory interface for interfacing with a substrate processing platform, the factory interface including a docking station and a factory interface robot to facilitate transfer of substrates from the factory interface to the substrate processing platform;
a substrate treatment apparatus coupled to the factory interface such that the factory interface robot can place substrates into or remove substrates from the substrate treatment apparatus; and
a gas supply coupled to the substrate treatment apparatus to provide a gas to an interior volume of the substrate treatment apparatus;
wherein the substrate treatment apparatus comprises:
an enclosure;
at least one opening in the enclosure to insert a substrate into or remove a substrate from the enclosure;
a movable substrate carrier, including a plurality of substrate holders, disposed within the enclosure to support a plurality of substrates in a vertically spaced-apart relation and to linearly move a plurality of substrates when disposed on the plurality of substrate holders;

a heater to heat an interior of the enclosure; and
a vent to exhaust the gas from the interior of the enclosure.

12. The apparatus of claim 11, wherein the enclosure is a vacuum enclosure.

13. The apparatus of claim 11, wherein the enclosure is a non-vacuum enclosure.

\* \* \* \* \*